(12) United States Patent
Kim et al.

(10) Patent No.: US 11,133,205 B2
(45) Date of Patent: Sep. 28, 2021

(54) WAFER OUT OF POCKET DETECTION

(71) Applicant: Applied Materials, Inc., Santa Clara, CA (US)

(72) Inventors: Sanggyum Kim, Sunnyvale, CA (US); Prasanth Narayanan, Santa Clara, CA (US); Subramanian Tamilmani, Fremont, CA (US); Mandyam Sriram, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/876,257

(22) Filed: May 18, 2020

(65) Prior Publication Data

US 2020/0373178 A1    Nov. 26, 2020

Related U.S. Application Data

(60) Provisional application No. 62/852,512, filed on May 24, 2019.

(51) Int. Cl.
*H01L 21/67* (2006.01)
*H01L 21/66* (2006.01)

(52) U.S. Cl.
CPC .. *H01L 21/67259* (2013.01); *H01L 21/67248* (2013.01); *H01L 22/10* (2013.01)

(58) Field of Classification Search
CPC ......... H01L 21/67248; H01L 21/67259; H01L 21/68735; H01L 21/68764; H01L 21/68771; H01L 21/68785
See application file for complete search history.

(56) References Cited

U.S. PATENT DOCUMENTS

| 6,654,668 | B1 | 11/2003 | Harada et al. | |
|---|---|---|---|---|
| 2013/0065403 | A1* | 3/2013 | Paranjpe | H01L 21/68707 438/758 |
| 2015/0376782 | A1* | 12/2015 | Griffin | G01D 5/24 118/712 |
| 2016/0027675 | A1* | 1/2016 | Ravid | H01L 21/67259 118/713 |

(Continued)

FOREIGN PATENT DOCUMENTS

| KR | 100323310 B1 | 5/2002 |
|---|---|---|
| KR | 100559679 B1 | 2/2005 |

(Continued)

OTHER PUBLICATIONS

PCT International Search Report and Written Opinion in PCT/US2020/033622 dated Sep. 4, 2020, 14 pages.

*Primary Examiner* — Jae Lee
(74) *Attorney, Agent, or Firm* — Servilla Whitney LLC

(57) ABSTRACT

Apparatus and methods to process one or more substrate are described. A processing chamber comprises a support assembly, a chamber lid, and a controller. The chamber lid has a front surface facing the support assembly, a first sensor on the front surface and a second sensor on the front surface, the first sensor positioned at a first distance from the central rotational axis, and the second sensor positioned at a second distance from the central rotational axis greater than the first distance. The controller is configured to determine if a substrate is within or outside of the substrate support region of the support assembly.

20 Claims, 6 Drawing Sheets

(56) References Cited

U.S. PATENT DOCUMENTS

2016/0351426 A1* 12/2016 Kwon ............... H01L 21/67259
2018/0037986 A1* 2/2018 Derckx ............. H01J 37/32724
2021/0010138 A1* 1/2021 Bode ................ G06K 19/06037

FOREIGN PATENT DOCUMENTS

KR         101471548 B1    10/2012
KR      20170016221 A     2/2017

* cited by examiner

WAFER OUT OF POCKET DETECTION

CROSS-REFERENCE TO RELATED APPLICATIONS

This application claims priority to U.S. Provisional Application No. 62/852,512, filed May 24, 2019, the entire disclosure of which is hereby incorporated by reference herein.

TECHNICAL FIELD

The present disclosure relates generally to apparatus and methods to deposit films. In particular, the disclosure relates to apparatus and methods for determining whether a substrate is in the pocket of a carousel substrate support.

BACKGROUND

Process uniformity in mainframe processing chambers can be poor due to a variety of factors. Rotating wafers throughout the process can help improve the within wafer uniformity. The amount of rotation, small and/or a few rotations can improve the uniformity. Rotating a wafer during processing can be time consuming and uses additional process hardware or space. For example, the wafers can be moved to a dedicated region of a processing tool where the wafer can be rotated. This is inefficient from a throughput perspective and uses additional floor space for a batch processing tool or cluster tool.

Additionally, multiple wafers are placed on a susceptor or carousel to be rotated. During the handoff, wafers can be misplaced outside of the pocket on the susceptor. Since there is no feedback signal showing whether the wafer is placed properly or not, the wafer placed outside the pocket may slide during processes and cause wafer breakage.

Therefore, there is a need for methods and apparatus to detect misplaced or out of pocket positions of wafers in mainframe process chambers, thus preventing wafer breakage.

SUMMARY

One or more embodiments of the disclosure are directed to a processing chamber. The processing chamber comprises: a support assembly having a central rotational axis and a plurality of substrate support regions spaced a distance from and around the central rotational axis, the support assembly configured to rotate the plurality of substrate support regions around the central rotational axis; a chamber lid having a front surface facing the support assembly, a first sensor on the front surface and a second sensor on the front surface, the first sensor positioned at a first distance from the central rotational axis, and the second sensor positioned at a second distance from the central rotational axis greater than the first distance; and a controller connected to the support assembly, the first sensor and the second sensor, the controller configured to determine if a substrate is within or outside of the substrate support region.

Additional embodiments of the disclosure are directed to a method. The method comprises: rotating a plurality of substrate support regions around a central rotational axis of a support assembly; measuring a first temperature profile comprising temperature at a first distance from the central rotational axis as a function of rotational angle of the support assembly using a first sensor; measuring a second temperature profile comprising temperature at a second distance from the central rotational axis as a function of rotational angle of the support assembly using a second sensor, the second distance greater than the first distance; and determining if a substrate is within the substrate support regions based on the first temperature profile and the second temperature profile.

Further embodiments of the disclosure are directed to a non-transitory computer readable medium. The non-transitory computer readable medium includes instructions, that, when executed by a controller of a processing chamber, cause the processing chamber to perform the operations of: rotating a plurality of substrate support regions around a central rotational axis of a support assembly; measuring a first temperature profile comprising temperature at a first distance from the central rotational axis as a function of rotational angle of the support assembly using a first sensor; measuring a second temperature profile comprising temperature at a second distance from the central rotational axis as a function of rotational angle of the support assembly using a second sensor, the second distance greater than the first distance; and determining if a substrate is within the substrate support regions based on the first temperature profile and the second temperature profile.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1A:
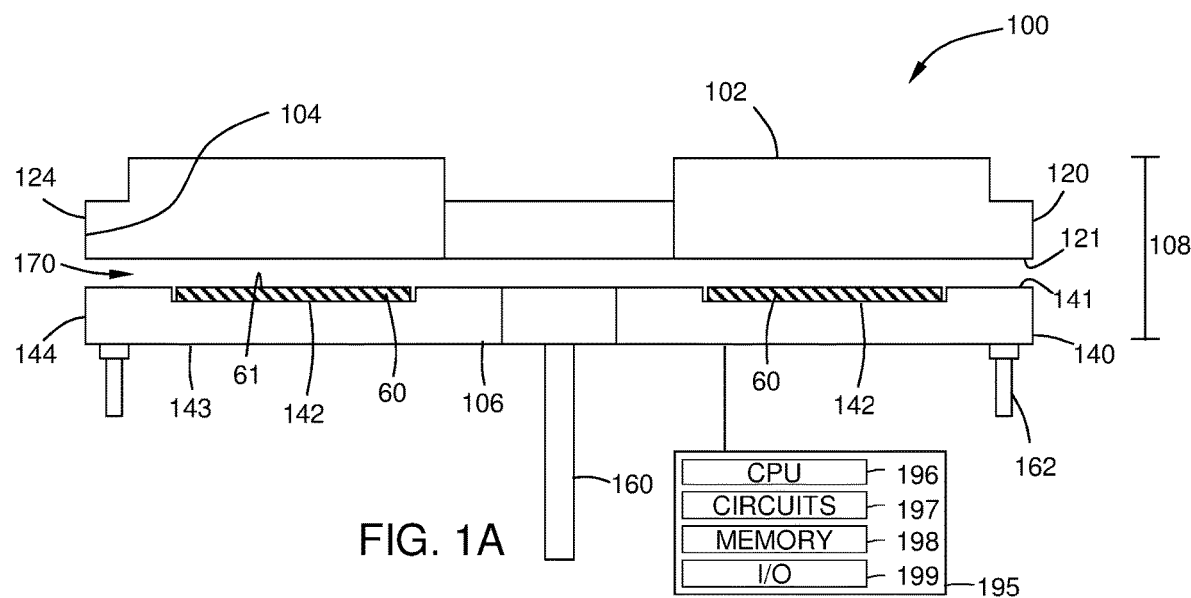
FIG. 1A shows a cross-sectional view of a batch processing chamber in accordance with one or more embodiment of the disclosure.

Before describing several exemplary embodiments of the invention, it is to be understood that the invention is not limited to the details of construction or process steps set forth in the following description. The invention is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Some embodiments of the disclosure are directed to film deposition processes using a batch processing chamber, also referred to as a spatial processing chamber. FIG. 1A shows a cross-section of a processing chamber 100 having a chamber top 102, a chamber sidewall 104, and a chamber bottom 106 which together form a chamber body 108 defining a processing volume.

The processing chamber 100 includes a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which, in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. In a binary reaction, the plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s).

Figure 2A:
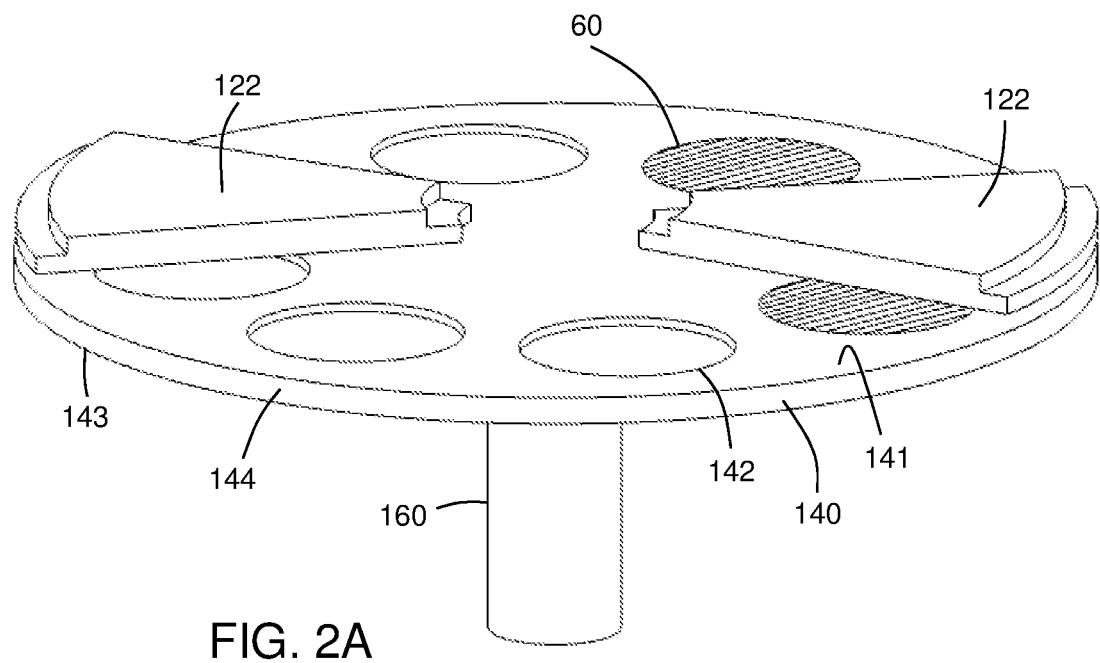
FIG. 2A shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120 within the chamber body 108 of the processing chamber 100. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess 142 has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1A, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1A includes a support post 160 which is capable of lifting, lowering, and rotating the susceptor assembly 140 around an axis. The susceptor assembly may include a heater, or gas lines, or electrical components within the center of the support post 160. The support post 160 may be the primary means of increasing or decreasing the gap 170 between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in FIG. 1A is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

In one or more embodiments, a substrate 60 is disposed on a top surface of the substrate support region. The substrate has a thickness in a range of about 0.5 mm to about 15 mm, including about 0.5 mm, about 0.6 mm, about 0.7 mm, about 0.8 mm, about 0.9 mm, about 1.0 mm, about 1.5 mm, about 2.0 mm, about 2.5 mm, about, 3.0 mm, about 3.5 mm, about 4.0 mm, about 4.5 mm, about 5.0 mm, about 5.5 mm, about 6.0 mm, about 6.5 mm, about 7.0 mm, about 7.5 mm, about 8.0 mm, about 8.5 mm, about 9.0 mm, about 9.5 mm, about 10.0 mm, about 10.5 mm, about 11.0 mm, about 11.5 mm, about 12.0 mm, about 12.5 mm, about 13.0 mm, about 13.5 mm, about 14.0 mm, about 14.5 mm, and about 15.0 mm. In one or more embodiments, the substrate has a thickness in a range of about 0.7 mm to about 0.8 mm.

Figure 1B:
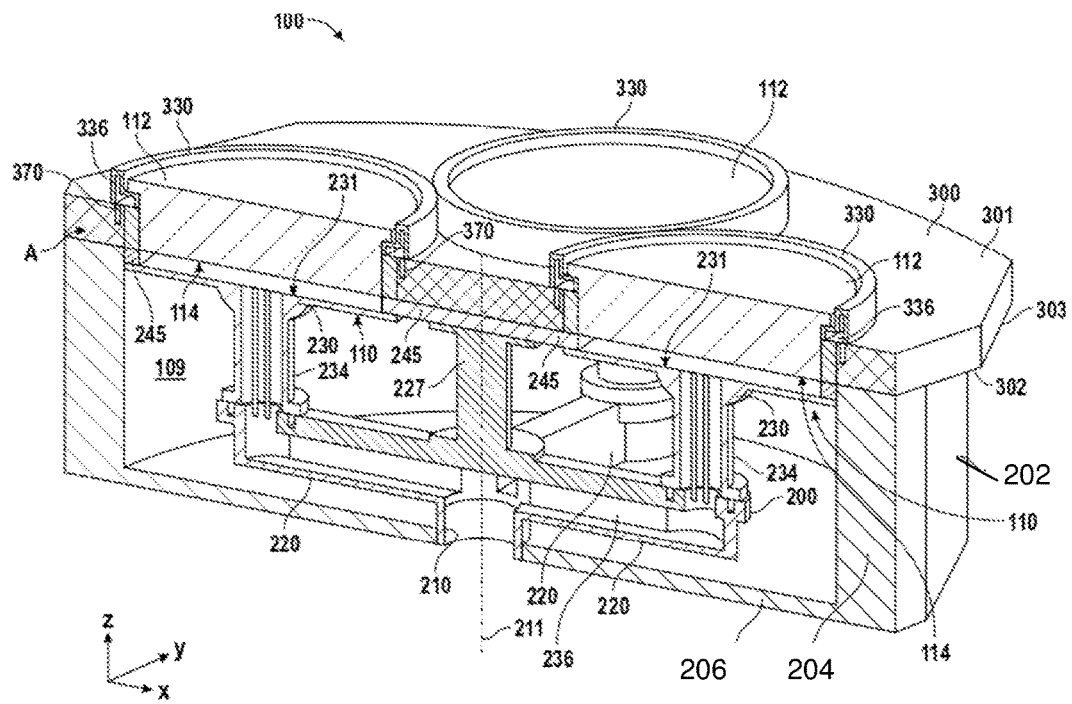
FIG. 1B shows a cross-sectional view of a batch processing chamber in accordance with one or more embodiment of the disclosure.

FIG. 1B illustrates an alternative processing chamber in accordance with one or more embodiments of the disclosure. The processing chamber 100 has a housing 202 with walls 204 and a bottom 206. The housing 202 along with the top plate 300 define an interior volume 109, also referred to as a processing volume.

The processing chamber 100 includes a plurality of process stations 110. The process stations 110 are located in the interior volume 109 of the housing 102 and are positioned in a circular arrangement around the rotational axis 211 of the support assembly 200. The process stations 110 are spatially arranged around the interior volume 109 of the processing chamber 100. Each process station 110 comprises a gas injector 112 having a front face 114. In some embodiments, the front faces 114 of each of the gas injectors 112 are substantially coplanar. The process stations 110 are defined as a region in which processing can occur. For example, a process station 110 can be defined by the support surface 231 of the heaters 230, as described below, and the front face 114 of the gas injectors 112.

The process stations 110 can be configured to perform any suitable process and provide any suitable process conditions. The type of gas injector 112 used will depend on, for example, the type of process being performed and the type of showerhead or gas injector. For example, a process station 110 configured to operate as an atomic layer deposition apparatus may have a showerhead or vortex type gas injector. Whereas, a process station 110 configured to operate as a plasma station may have one or more electrode and/or grounded plate configuration to generate a plasma while allowing a plasma gas to flow toward the wafer. Suitable process stations 110 include, but are not limited to, thermal processing stations, microwave plasma, three-electrode CCP, ICP, parallel plate CCP, UV exposure, laser processing, pumping chambers, annealing stations and metrology stations.

Figure 2B:
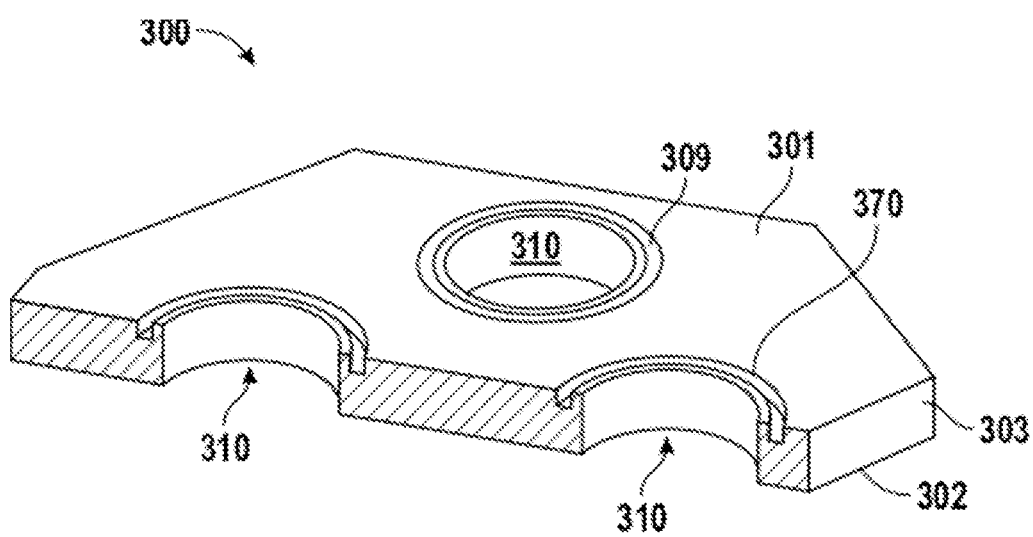
FIG. 2B shows a top plate of a processing chamber in accordance with one or more embodiment of the disclosure.

Some embodiments of the disclosure are directed to top plates 300 (or chamber lids) for multi-station processing chambers. Referring to FIG. 2B, the top plate 300 has a top surface 301 and a bottom surface 302 defining a thickness of the lid, and one or more edges 303. The top plate 300 includes at least one opening 310 extending through the thickness thereof. The openings 310 are sized to permit the addition of a gas injector 112 which can form a process station 110.

Figure 3A:
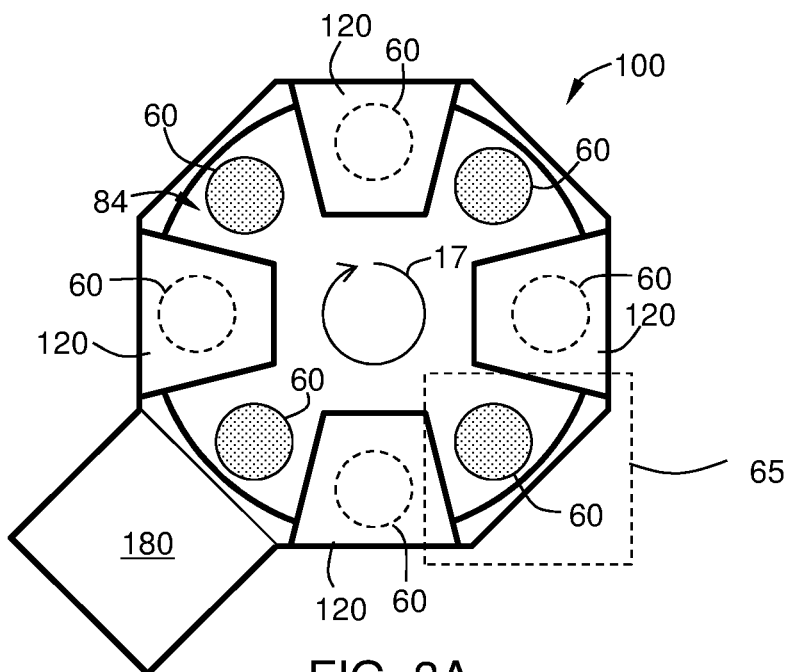
FIG. 3A shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3A, the processing chamber 100 has four gas distribution assemblies 120 and four substrates 60. At the outset of processing, the substrates 60 can be positioned between the gas distribution assemblies 120. Rotating 17 the susceptor assembly 140 by 45° will result in each substrate 60 which is between gas distribution assemblies 120 to be moved to another gas distribution assembly 120 for film deposition, as illustrated by the dotted circle under the gas distribution assemblies 120. An additional 45° rotation would move the substrates 60 away from the gas distribution assemblies 120. The number of substrates 60 and gas distribution assemblies 120 can be the same or different. In some embodiments, there are the same numbers of wafers being processed as there are gas distribution assemblies. In one or more embodiments, the number of wafers (or substrates 60) being processed are a fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight processing regions separated by gas curtains and the susceptor assembly 140 can hold six wafers.

The processing chamber 100 shown in FIG. 3A is merely representative of one possible configuration and should not be taken as limiting the scope of the disclosure. Here, the processing chamber 100 includes a plurality of gas distribution assemblies 120. In the embodiment shown, there are four gas distribution assemblies 120 (also called injector assemblies) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2A.

The embodiment shown in FIG. 3A includes a load lock chamber 180, or an auxiliary chamber like a buffer station. This chamber 180 is connected to a side of the processing chamber 100 to allow, for example, the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing between each layer deposition (e.g., exposure to plasma).

Figure 3B:
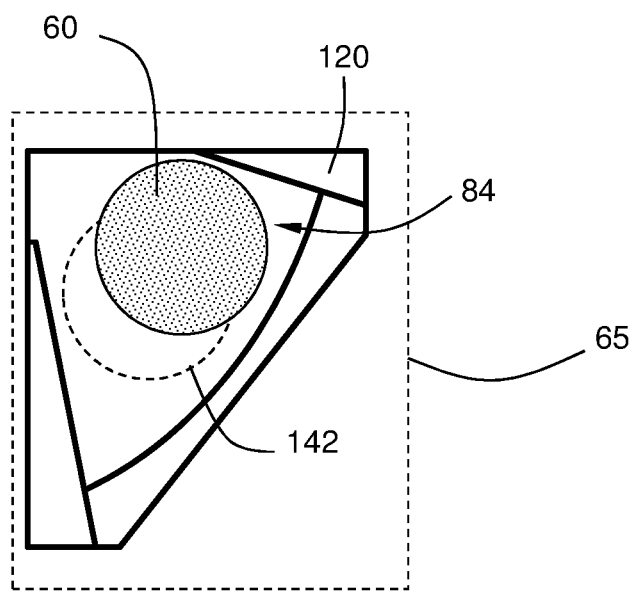
FIG. 3B shows an enlarged schematic view of the batch processing chamber of FIG. 3A in accordance with one or more embodiment of the disclosure.

As illustrated in FIG. 3B, which is an enlarged view of a portion 65 of the processing chamber illustrated in FIG. 3A, in one or more embodiments, the substrates 60 when rotated may not sit aligned in the recess (or pocket) 142. In such cases, the substrate 60 is considered out-of-pocket, which can be detrimental to the substrate, leading to breakage of the substrate 60.

Figure 3C:
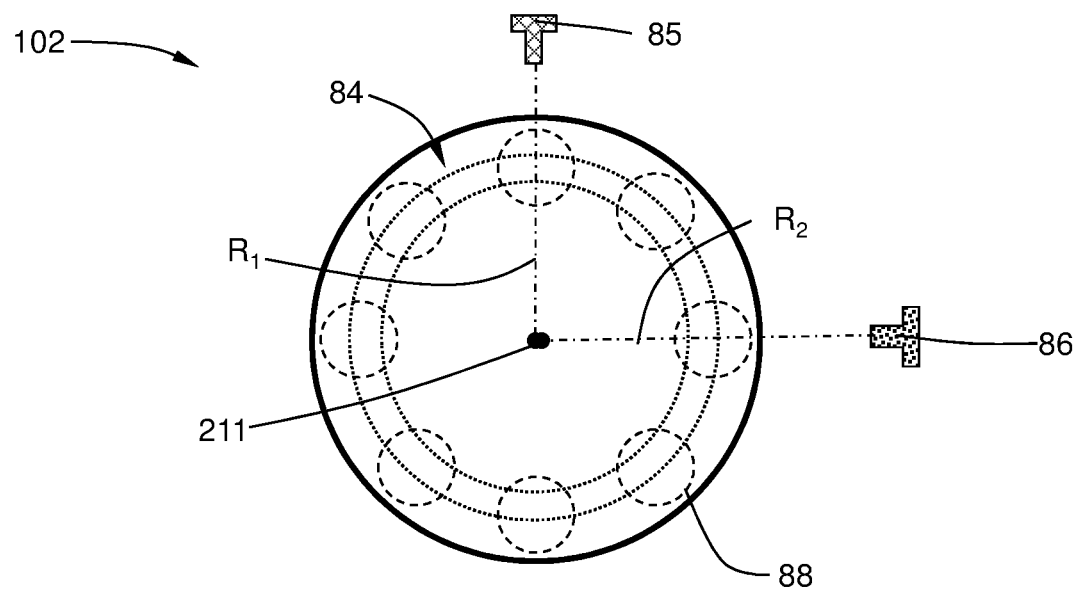
FIG. 3C shows a schematic view of a batch processing chamber lid in accordance with one or more embodiment of the disclosure.
Figure 3D:
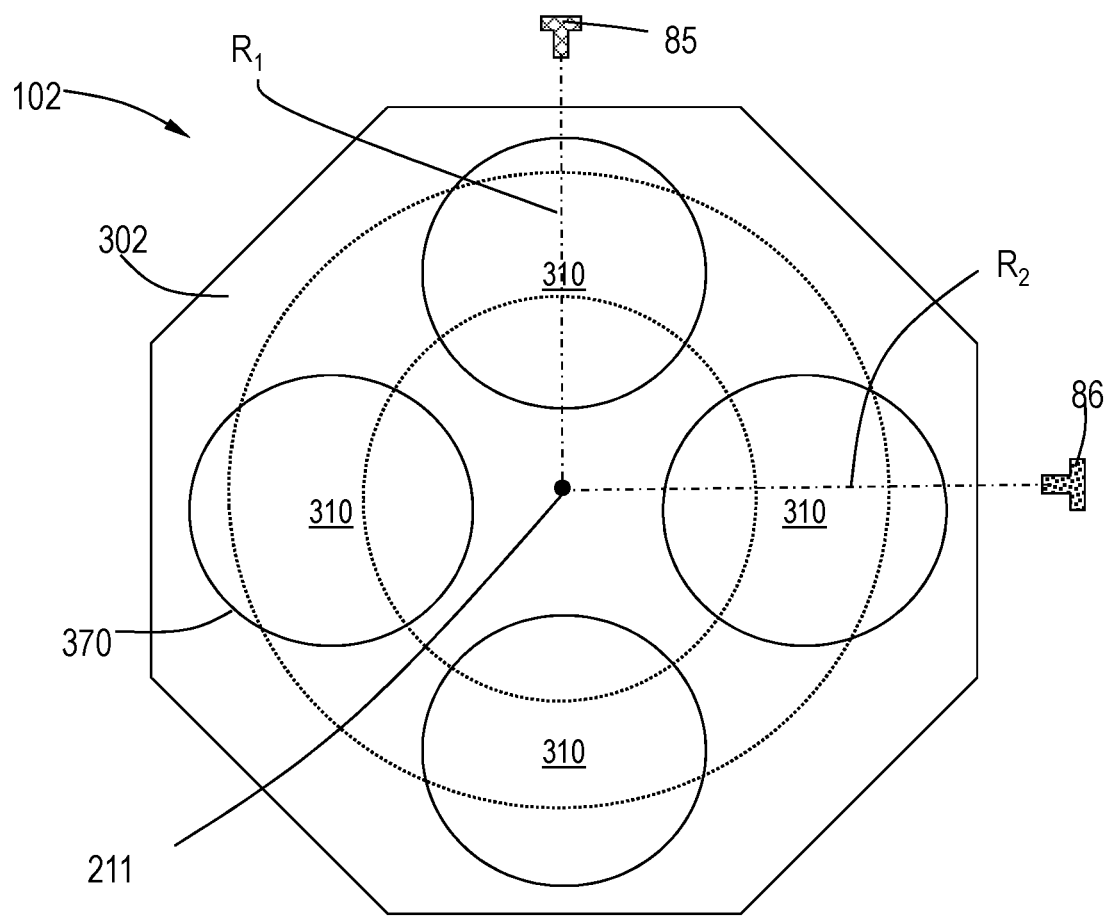
FIG. 3D shows a schematic view of a batch processing chamber lid in accordance with one or more embodiment of the disclosure.

Referring to FIGS. 3C and 3D, accordingly, in one or more embodiments, a processing chamber is advantageously provided wherein the chamber top 102 (or chamber lid) includes a first sensor 85 on the front surface and a second sensor 86 on the front surface the first sensor 85 positioned at a first distance $R_1$ from the central rotational axis 211, and the second sensor 86 positioned at a second distance $R_2$ from the central rotational axis 211 greater than the first distance $R_1$. The controller 195 (illustrated in FIG. 1A), which is connected to the support assembly 140 (or the susceptor assembly 140), the first sensor 85, and the second sensor 86, is configured to determine if a substrate 60 is within or outside of the substrate support region 88. In one or more embodiments, the temperature data is collected from the controller, and this is used to determine if the wafer is within or outside the substrate support region. Thus, one or more embodiments advantageously provide a processing chamber comprising: a support assembly 140 having a central rotational axis and a plurality of substrate support regions 142 spaced a distance from and around the central rotational axis. The support assembly 140 is configured to rotate the plurality of substrate support regions 88 around the central rotational axis. In one or more embodiments, a chamber lid 102 having a front surface (not illustrated) facing the support assembly 140, a first sensor 85 on the front surface and a second sensor 86 on the front surface, the first sensor 85 positioned at a first distance $R_1$ from the central rotational axis, and the second sensor 86 positioned at a second distance $R_2$ from the central rotational axis greater than the first distance $R_1$. In one or more embodiments, the first distance $R_1$ and second distance $R_2$ are between in inner diameter and an outer diameter of the substrate support regions.

In one or more embodiments, a controller 195 is connected to the support assembly 140, the first sensor 85, and the second sensor 86, the controller 195 configured to determine if a substrate 60 is within or outside of the substrate support region 88. In one or more embodiments, the first sensor 85 and the second sensor 86 independently comprises one or more of a pyrometer, through beam, thermistor, thermometer, thermocouple, temperature gauge, or IR camera. In one or more embodiments, the first sensor 85 and the second sensor 86 independently detect changes in temperature between the support assembly 140 and a substrate 60 and the controller 195 is configured to determine whether the substrate 60 is within the substrate support region 140 based on the temperature measurements.

Referring to FIG. 3C, in one or more embodiments, the substrate support regions 88 comprise recesses 142 sized to support a substrate 60 in a top surface of the support assembly 140, and the controller 195 determines if the substrate 60 is within the recess 142.

Figure 3E:
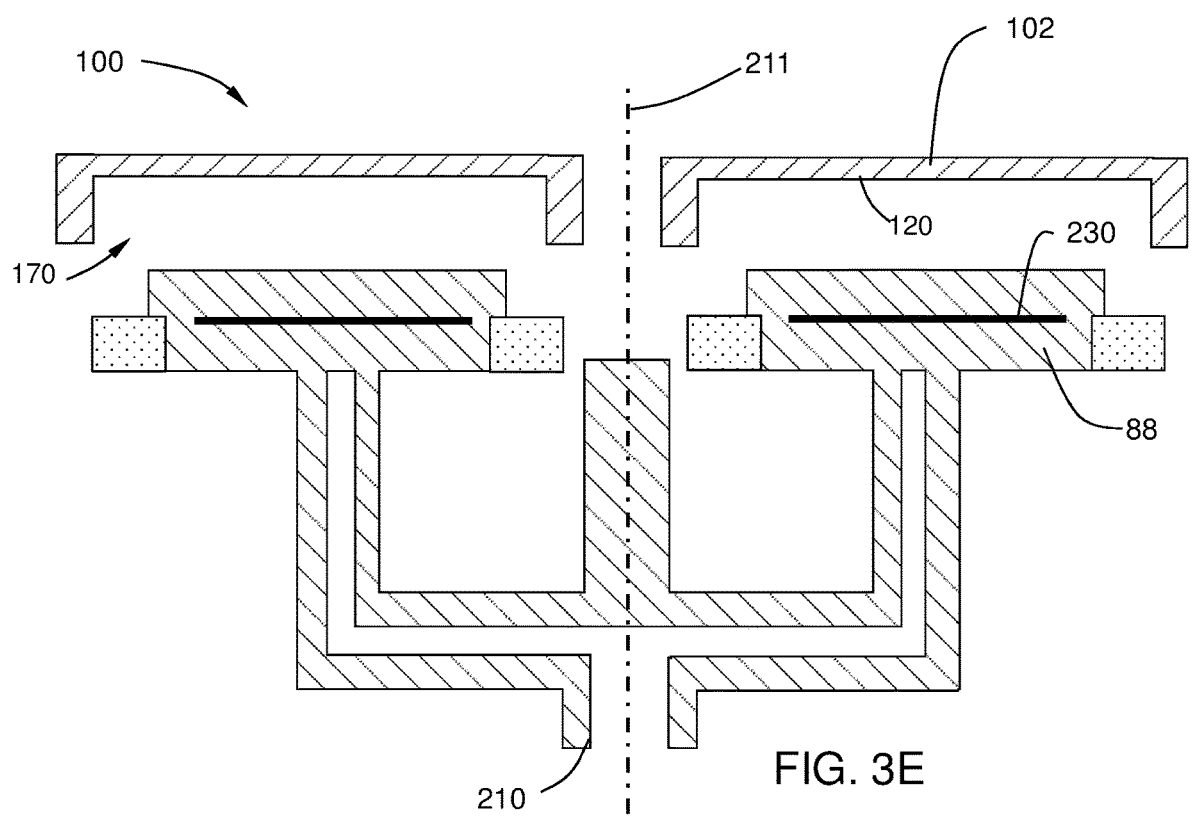
FIG. 3E shows a schematic view of a batch processing chamber in accordance with one or more embodiment of the disclosure.

Referring to FIG. 3E, in one or more embodiments, the substrate support regions 88 may comprise a heater 230 positioned at the outer end of substrate support regions 88. In some embodiments, each substrate support region 88 has a heater 230. The center of the heaters 230 are located at a distance from the rotational axis 211 so that upon rotation of the center base 210 the heaters 230 move in a circular path.

Referring to FIG. 1B, the heaters 230 have a support surface 231 which can support a wafer. In some embodiments, the heater 230 support surfaces 231 are substantially coplanar. As used in this manner, "substantially coplanar"

means that the planes formed by the individual support surfaces 231 are within ±5°, ±4°, ±3°, ±2° or ±1° of the planes formed by the other support surfaces 231.

In some embodiments, the heaters 230 are positioned directly on the outer end of substrate support regions 88. In some embodiments, as illustrated in FIG. 1B, the heaters 230 are elevated above the outer end 222 of the support arms 220 by a heater standoff 234. The heater standoffs 234 can be any size and length to increase the height of the heaters 230.

In some embodiments, a channel 236 is formed in one or more of the center base 210, the support arms 220 and/or the heater standoffs 234. The channel 236 can be used to route electrical connections or to provide a gas flow.

The heaters can be any suitable type of heater known to the skilled artisan. In some embodiments, the heater is a resistive heater with one or more heating elements within a heater body.

In some embodiments, the chamber lid 102 further comprises a plurality of openings configured to deliver a flow of gases toward the support assembly 140. In one or more embodiments, at least some of the plurality of openings are radially aligned slots. The radially aligned slots may be uniformly spaced at different angular positions.

Figure 4:
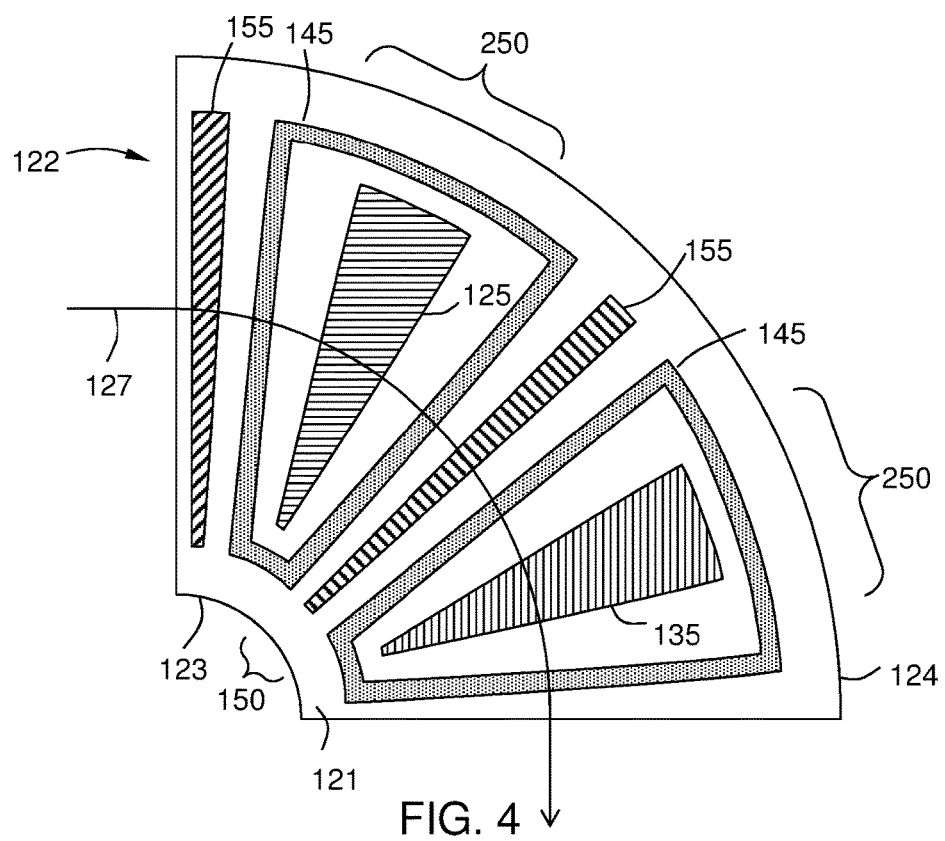
FIG. 4 shows a schematic view of a portion of a wedge shaped gas distribution assembly for use in a batch processing chamber in accordance with one or more embodiment of the disclosure.
Figure 5:
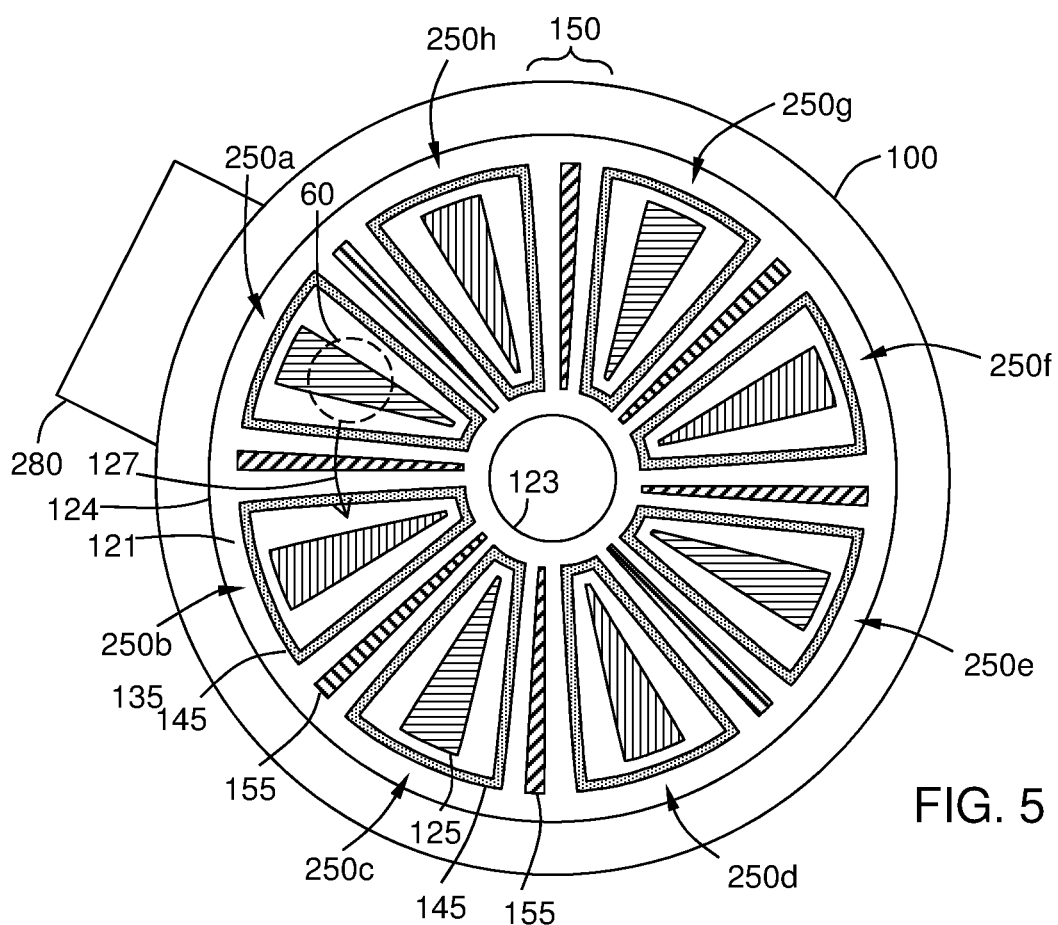
FIG. 5 shows a schematic view of a batch processing chamber in accordance with one or more embodiments of the disclosure.

FIG. 4 shows a sector or portion of a gas distribution assembly, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongated gas ports 125, 135, 155 and elongated vacuum ports 145 in a front surface 121 of the gas distribution assembly 120. The plurality of elongated gas ports 125, 135, 155 and elongated vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first gas port 125 and the second gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, ten, eleven or twelve processing regions.

During processing a substrate may be exposed to more than one processing region 250 at any given time. However, the portions that are exposed to the different processing regions will have a gas curtain separating the two. For example, if the leading edge of a substrate enters a processing region including the second gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first processing region 250a through the eighth processing region 250h, including all processing regions between.

Embodiments of the disclosure are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions. In some embodiments, the number of processing regions is greater than the number of gas curtains and one or more of the gases present in the processing regions not separated by a gas curtain are combined.

A plurality of substrates 60 are positioned on a substrate support, for example, the susceptor assembly 140 shown FIGS. 1A and 1B. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example, if the first reactive gas is flowing into processing regions 250b through processing region 250h, an inert gas would be flowing into processing region 250a. The inert gas can be flowed through the first reactive gas port 125 or the second gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Accordingly, one or more embodiments of the disclosure are directed to processing methods utilizing a batch processing chamber like that shown in FIG. 5. A substrate 60 is placed into the processing chamber which has a plurality of sections 250, each section separated from adjacent section by a gas curtain 150. At least a portion of the substrate surface is exposed to a first process condition in a first section 250a of the processing chamber.

The substrate surface is laterally moved through a gas curtain 150 to a second section 250b of the processing chamber. The substrate surface is exposed to a second process condition in the second section 250b.

The substrate surface is laterally moved through a gas curtain 150 to a third section 250c of the processing chamber. The substrate surface can then be exposed to a third process condition in the third section 250c. In some embodiments, the third section 250c contains the same process condition as one or more of the first section 250a or the second section 250b.

The substrate surface is laterally moved through a gas curtain 150 to a fourth section 250d of the processing chamber. The substrate surface can then be exposed to a fourth process condition in the fourth section 250d. In some embodiments, the fourth section 250d contains the same process condition as one or more of the first section 250a, the second section 250b or the third section 250c.

The fifth section 250e, sixth section 250f, seventh section 250g and/or eighth section 250h can each independently have one or more of the first through fourth process conditions or can have different process conditions. In some embodiments, the first, third, fifth and seventh sections have the same process conditions and the second, fourth, sixth and eighth sections have the same process conditions so that a wafer making one cycle around the processing chamber would be exposed to four repeating exposures of the first process condition and the second process condition. For example, the wafer might be encounter four repeated exposures to an A process and a B process in the first process condition and the second process condition, respectively, to make four AB repetitions.

In some embodiments, the first and fifth sections have a first process condition, the second and sixth sections have a second process condition, the third and seventh sections have a third process condition and the fourth and eighth sections have a fourth process condition. A wafer making a complete cycle around the processing chamber of this configuration would have two repeated exposures to the four sequential process conditions. For example, the wafer might encounter two repeated exposures to an A process, a B process, a C process and a D process in the first process condition, second process condition, third process condition and fourth process condition, respectively, to make two ABCD repetitions.

In some embodiments, at least one of the processing regions is a plasma processing region in which a plasma is generated and at least one of the processing regions is a non-plasma processing region in which there is no plasma generated. The plasma processing region can be a direct plasma processing region in which the susceptor assembly or the substrate acts as an electrode or a remote plasma processing region in which the plasma is generated without the susceptor assembly or the substrate acting as an electrode. The skilled artisan will recognize that a plasma processing region, either direct or remote, will have a suitable power source connected to an RF hot electrode. The power source supplies power of a predetermined frequency to the RF hot electrode. The powered electrode ionizes a gas within the plasma source to form the plasma.

Some embodiments of the disclosure are directed to processing methods comprising moving a substrate between a first processing region without a plasma and a second processing region with a plasma. The first processing region is also referred to as a non-plasma processing region. The second processing region is also referred to as a plasma processing region. The substrate has a breakdown voltage. The skilled artisan will recognize that the substrate refers to any part of the substrate or device (e.g., transistor) being formed on the substrate.

The substrate of some embodiments is larger than the processing region so that not all of the substrate can fit within the processing region at any given time. During movement of the substrate between the plasma processing region and the non-plasma processing region parts of the substrate are exposed to the plasma and parts of the substrate are not exposed to plasma. This non-uniform plasma exposure results in charge buildup or a voltage (potential) differential on the substrate.

In some embodiments, rotation of the substrate around the central axis of the susceptor assembly is sufficient so that any given point on the substrate is within a particular processing region (e.g., the second processing region or plasma processing region) for a time in the range of about 100 milliseconds to about 500 milliseconds. In some embodiments, the rotation speed is sufficient so that any given point on the substrate is exposed to the particular processing region for a time in the range of about 150 milliseconds to about 300 milliseconds, or about 200 milliseconds.

One or more embodiments are directed to a method. The method of one or more embodiments comprises rotating a plurality of substrate support regions around a central rotational axis of a support assembly. In one or more embodiments, a first temperature profile comprising temperature at a first distance from the central rotational axis is measured as a function of rotational angle of the support assembly using a first sensor. In one or more embodiments, a second temperature profile comprising temperature at a second distance from the central rotational axis is measured as a function of rotational angle of the support assembly using a second sensor, the second distance greater than the first distance. In one or more embodiments, it is determined whether a substrate is within the substrate support regions based on the first temperature profile and the second temperature profile.

In one or more embodiments, determining if the substrate is within the substrate support region further comprises determining an angular relationship of temperature changes from the first temperature profile and the second temperature profile.

In some embodiments, the method further comprises comparing a positional profile based on the angular relationship of temperature changes from the first temperature profile and the second temperature profile to a standard positional profile of the substrate support regions. In one or more embodiments, the method further comprises determining the center of the substrate by fitting at least three edge positions of the substrate.

Without intending to be bound by theory, it is thought that the method is based upon the first and second temperature profile. In one or more embodiments, the transition point between the substrate and support assembly is determined relative to the substrate coordinate. Based upon the transition points, the center position of the substrate is calculated. Based upon the difference between the center position and the nominal center position (either calibrated or determined by the design), the algorithm determines whether the substrate is place on the support regions or not.

In some embodiments, a controller is coupled to the susceptor assembly and the gas distribution assembly. The controller has one or more configurations to control the various functions and processes. In some embodiments, the configurations are selected from a first configuration to rotate the susceptor assembly about the central axis, a second configuration to provide a flow of gas into the non-plasma processing region, a third configuration to provide a flow of gas into the plasma processing region, a fourth configuration to provide power to the plasma processing region to ignite a plasma and/or a fifth configuration to pulse the power to the plasma processing region to generate an ON time and an OFF time for the plasma processing region.

The methods described herein can be executed by a non-transitory computer readable storage medium including instructions, that, when executed by a controller or processing unit, of a processing chamber, cause the processing system to perform the disclosed methods. In some embodiments, the non-transitory computer-readable storage medium includes instructions, that, when executed by a processing unit (e.g., controller) of the processing chamber cause the processing chamber to perform the operations of: rotating a plurality of substrate support regions around a central rotational axis of a support assembly; measuring a first temperature profile comprising temperature at a first distance from the central rotational axis as a function of rotational angle of the support assembly using a first sensor; measuring a second temperature profile comprising temperature at a second distance from the central rotational axis as a function of rotational angle of the support assembly using a second sensor, the second distance greater than the first distance; and determining if a substrate is within the substrate support regions based on the first temperature profile and the second temperature profile.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing chamber comprising:
   a support assembly having a central rotational axis and a plurality of substrate support regions spaced a distance from and around the central rotational axis, the support assembly configured to rotate the plurality of substrate support regions around the central rotational axis;
   a chamber lid having a front surface facing the support assembly, a first sensor on the front surface and a second sensor on the front surface, the first sensor positioned at a first distance from the central rotational axis, and the second sensor positioned at a second distance from the central rotational axis greater than the first distance; and
   a controller connected to the support assembly, the first sensor and the second sensor, the controller configured to determine if a substrate is within or outside of the substrate support region.

2. The processing chamber of claim 1, wherein the substrate support regions comprise recesses sized to support a substrate in a top surface of the support assembly and the controller determines if the substrate is within the recess.

3. The processing chamber of claim 1, wherein each of the substrate support regions comprises a heater and the substrate support regions are positioned relative to the heaters.

4. The processing chamber of claim 1, wherein the first sensor and the second sensor independently comprise one or more of a pyrometer, through beam, thermistor, thermometer, thermocouple, temperature gauge, or IR camera.

5. The processing chamber of claim 1, wherein the first sensor and the second sensor independently detect changes in temperature between the support assembly and a substrate and the controller is configured to determine whether the substrate is within the substrate support region based on the temperature measurements.

6. The processing chamber of claim 1, wherein the first distance and second distance are between in inner diameter and an outer diameter of the substrate support regions.

7. The processing chamber of claim 1, wherein the chamber lid further comprises a plurality of openings configured to deliver a flow of gases toward the support assembly.

8. The processing chamber of claim 7, wherein at least some of the plurality of openings are radially aligned slots.

9. The processing chamber of claim 8, wherein the radially aligned slots are uniformly spaced at different angular positions.

10. The processing chamber of claim 2, wherein the support assembly comprises a circular groove in the at least one recess, the circular groove in fluid communication with one or more of a vacuum source or an inert gas source.

11. The processing chamber of claim 1, further comprising a substrate disposed on a top surface of the substrate support region.

12. The processing chamber of claim 10, wherein the substrate has a thickness in a range of about 0.7 mm to about 0.8 mm.

13. A method comprising:
    rotating a plurality of substrate support regions around a central rotational axis of a support assembly;
    measuring a first temperature profile comprising temperature at a first distance from the central rotational axis as a function of rotational angle of the support assembly using a first sensor;
    measuring a second temperature profile comprising temperature at a second distance from the central rotational axis as a function of rotational angle of the support assembly using a second sensor, the second distance greater than the first distance; and
    determining if a substrate is within the substrate support regions based on the first temperature profile and the second temperature profile.

14. The method of claim 12, wherein determining if the substrate is within the substrate support region further comprises determining an angular relationship of temperature changes from the first temperature profile and the second temperature profile.

15. The method of claim 13, further comprising comparing a positional profile based on the angular relationship of temperature changes from the first temperature profile and the second temperature profile to a standard positional profile of the substrate support regions.

16. The method of claim 14, further comprising determining the center of the substrate by fitting at least three edge positions of the substrate.

17. The method of claim 13, further comprising delivering a flow of gases toward the support assembly through a plurality of openings in a chamber lid of the support assembly.

18. The method of claim 17, wherein at least some of the plurality of openings are radially aligned slots.

19. The method of claim 13, wherein the substrate has a thickness in a range of about 1 mm to about 15 mm.

20. A non-transitory computer readable medium including instructions, that, when executed by a controller of a processing chamber, cause the processing chamber to perform the operations of:
- rotating a plurality of substrate support regions around a central rotational axis of a support assembly;
- measuring a first temperature profile comprising temperature at a first distance from the central rotational axis as a function of rotational angle of the support assembly using a first sensor;
- measuring a second temperature profile comprising temperature at a second distance from the central rotational axis as a function of rotational angle of the support assembly using a second sensor, the second distance greater than the first distance; and
- determining if a substrate is within the substrate support regions based on the first temperature profile and the second temperature profile.

* * * * *